310-800

4/5/83 XR 4,379,246 SR

United States Patent [19]

Guntersdorfer et al.

[11] 4,379,246

[45] Apr. 5, 1983

[54] POLYMERIC PIEZOELECTRIC DRIVE ELEMENT FOR WRITING JETS IN MOSAIC INK PRINTING DEVICES

[75] Inventors: Max Guntersdorfer, Zorneding; Peter Kleinschmidt, Munich; Klaus Dietrich, Gauting, all of Fed. Rep. of Germany

[73] Assignee: Siemens Aktiengesellschaft, Berlin & Munich, Fed. Rep. of Germany

[21] Appl. No.: 148,496

[22] Filed: May 9, 1980

[30] Foreign Application Priority Data

Jul. 5, 1979 [DE] Fed. Rep. of Germany ....... 2927269

[51] Int. Cl.3 ...................... H01L 41/08; G01D 15/18

[52] U.S. Cl. .................................... 310/328; 310/800; 346/140 R

[58] Field of Search ........................ 310/328, 330–332, 310/800; 346/75, 140 R, 140 A, 140 PD, 140 IJ

[56] References Cited

U.S. PATENT DOCUMENTS

| | | | |
|---|---|---|---|
| 3,683,212 | 8/1972 | Zoltan | 320/328 |
| 3,798,474 | 3/1974 | Cassand et al. | 310/800 X |
| 3,946,398 | 3/1976 | Kyser et al. | 346/1 |
| 4,095,238 | 6/1978 | Kattner | 346/140 R |
| 4,161,670 | 7/1979 | Kern | 310/317 |
| 4,166,229 | 8/1979 | DeReggi et al. | 310/800 X |
| 4,216,403 | 8/1980 | Krempl et al. | 310/800 X |
| 4,216,483 | 8/1980 | Kyser et al. | 346/140 RD |
| 4,282,532 | 8/1981 | Markham | 310/800 X |

FOREIGN PATENT DOCUMENTS

| | | | |
|---|---|---|---|
| 2537767 | 1/1977 | Fed. Rep. of Germany | 310/800 |
| 7726763 | 4/1978 | France . | |

OTHER PUBLICATIONS

Article Entitled: "Laminated Piezoelectric Ceramic Transdicers", From Apr. 1975, Electronic Engineering.
Article Entitled: "Confocal Pair of Concave Transducers Made of $PVF_2$ Piezoelectric Films", From Japan Journal of Applied Physics, vol. 16, (1977), No. 12.

*Primary Examiner*—Mark O. Budd
*Attorney, Agent, or Firm*—Hill, Van Santen, Steadman, Chiara & Simpson

[57] ABSTRACT

A piezoelectric drive element which surrounds an ink channel in a writing jet in a mosaic printing device is a winding formed by plies of thin synthetic foil having piezoelectric properties. The plies of the foil contact adjacent plies over large areas of adjacent plies and form a compression chamber in the interior of the winding which surrounds the ink chamber. Application of a voltage of a first polarity to the winding expands the winding and application of a voltage having an opposite polarity then contracts the winding forcing ink out of the chamber for printing. The winding and chamber may be surrounded by a covering of silicon rubber.

6 Claims, 3 Drawing Figures

POLYMERIC PIEZOELECTRIC DRIVE ELEMENT FOR WRITING JETS IN MOSAIC INK PRINTING DEVICES

BACKGROUND OF THE INVENTION

1. Field of the Invention

The present invention relates to piezoelectric drive elements for writing jets, particularly of the type utilized in mosaic ink printing devices in which a writing fluid contained in a compression chamber cylindrically enclosed by the drive element is ejected in droplets by controlled contraction of the compression chamber.

2. Description of the Prior Art

Utilization of piezoelectric material for the drive element of writing jets in ink printing devices is well known in the art. A piezoelectric drive element for writing jets is known, for example, from German AS No. 25 37 767 and the employment of this effect in a mosaic ink printing device is disclosed, for example, in German AS No. 25 48 691, corresponding to U.S. Pat. No. 1,161,670.

In known arrangements of the above type, tubular drive elements of polarized ceramic cylindrically enclose a writing fluid channel. The interior diameter of each of the drive elements is reduced upon the application of an electrical voltage having a polarity in the direction of the polarization voltage of the ceramic, and is expanded upon application of an electrical voltage having a plurality opposite to the polarization voltage. By the use of a suitable drive circuit, the piezoelectric drive element is first expanded and then driven into a constricted state by reversal of polarity of the voltage, resulting in ejection of a writing fluid droplet. Such devices require voltage of more than 80 volts supplied in pulse-form for the operation thereof. Such a circuit requires a considerable outlay in expense for an entire spray head inasmuch as a pulse gene.ating circuit must be present for each of the piezoelectrically driven writing jets.

It is a problem in the art to provide a piezoelectric drive element for a writing jet having decreased voltage requirements and thus requiring decreased circuit outlay for driving of the piezoelectric element.

SUMMARY OF THE INVENTION

It is an object of the present invention to provide a piezoelectric drive element for writing jets in mosaic ink printing devices which is operable with significantly reduced voltage requirements and which can be employed in a spray head at reduced cost.

The above object is inventively achieved in a piezoelectric drive element consisting of a winding having a plurality of parallel plies which surrounds an ink channel to form a compression chamber within the portion of the channel surrounded by the winding. The plies of the winding contact adjacent plies over a large area thereof, and may be surrounded in a covering of flexible silicon rubber. A voltage applied to the winding having a first polarity will expand the interior diameter of the winding and a subsequently applied voltage having an opposite polarity will constrict the interior diameter of the winding to force writing fluid out of the chamber in the form of droplets.

In a further embodiment of the invention, the winding may consist of overlapping synthetic foil and insulating material, so that when wound and viewed in cross section, alternating layers of synthetic foil and insulating material are present.

DESCRIPTION OF THE PREFERRED EMBODIMENTS

Figure 1:
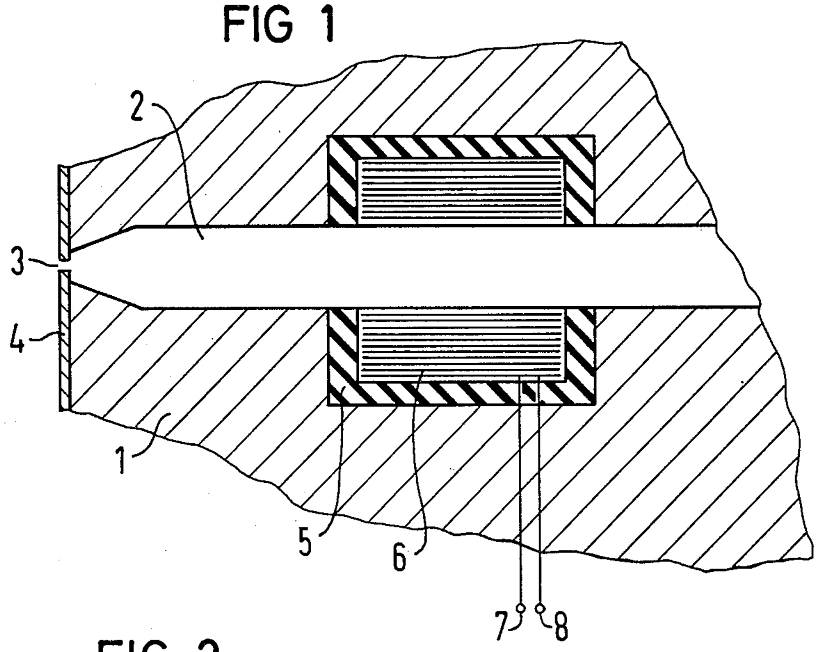
FIG. 1 is a sectional view of a writing jet with a drive element constructed in accordance with the principles of the present invention.

A sectional view of a writing jet for a mosaic ink printing device is shown in FIG. 1 with the portion of the write head shown referenced at 1. The write head 1 contains a writing fluid channel 2 which tapers at one end and terminates in a discharge aperture 3 to form a writing jet. The write head 1 is covered by a front plate 4 which has apertures therein in registry with the discharge aperture 3 associated with each channel 2. It will be understood that although a single channel 2 is shown in FIG. 1, a write head may contain any number of such channels and the cover plate 4 will have a corresponding aperture pattern therein to accommodate whatever arrangement of channels 2 is desired.

The writing fluid channel 2 is cylindrically surrounded along a portion of its length by a drive element consisting of a covering 5 consisting of elastic material such as, for example, silicon rubber, and a winding 6 which is formed by wound plies of a thin foil having piezoelectric properties with adjacent plies of the piezoelectric foil being in physical contact over large portions of their areas. The elastic covering 5 covers the winding 6 over its entire outer surface as well as the end faces thereof. A so called compression chamber is formed in that portion of the writing fluid channel 2 which is surrounded by the winding 6.

The voltage impulses required for the operation of the piezoelectric drive element are applied thereto via terminals 7 and 8. The voltage impulses effect a change of the inside radius of the winding as a function of the polarity of the applied voltage and the direction of the polarization voltage of the piezoelectric material. The winding 6 will contract at its inner radius when a voltage is applied having a polarity which is the same as the polarization voltage and will expand when a voltage of the opposite polarity is applied. When the winding 6 is contracted, writing fluid within the compression chamber will be forced out of the discharge aperture 3 in droplet form.

Figure 2:
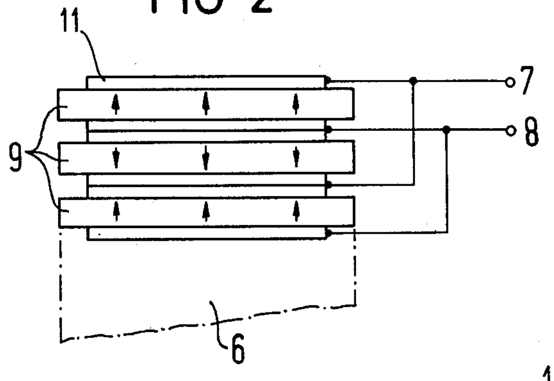
FIG. 2 is an enlarged side view of a portion of the plies of the winding in the drive element of FIG. 1.

FIG. 2 illustrates an enlarged view of an embodiment for the winding 6 of FIG. 1. As shown in FIG. 2, the winding consists of a plurality of plies of a thin foil 9, which may, for example, be comprised of polyvinylidene difluoride (PVDF), with contact between adjacent plies being made over large areas of their surfaces. The winding is formed by coiling two foil layers each having piezoelectric properties which are initially disposed with one layer placed atop the other. Attached to portions of the surface of each foil layer are electrodes 11 which are in turn connected to the voltage terminals 7 and 8.

Figure 3:
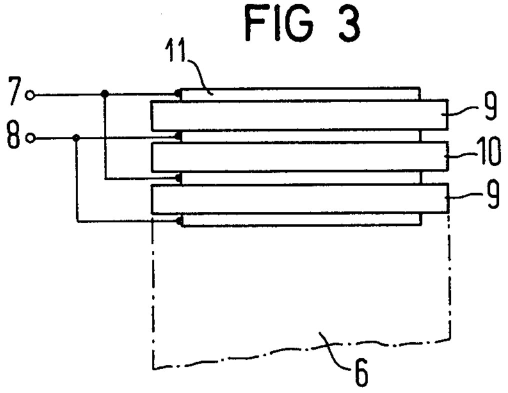
FIG. 3 is an enlarged side view of another embodiment of the drive element of FIG. 1 including an insulating layer.

As shown in FIG. 3, instead of utilizing two piezoelectric foil layers 9, one of the foil layers may be replaced by an insulating layer 10.

In either of the embodiments shown in FIGS. 2 and 3, it is essential that a high degree of contact exists between the individual plies of the winding. This may be achieved, for example, by mechanically pre-stressing the winding material when coiling the foils or by the utilization of a thin coating on the foils before the winding operation with viscous adhesives or other suitable liquids. The winding is then either directly cast into the rigid synthetic body 1 of the spray head or, as shown in FIG. 1, may be encapsulated over its entire outer surface as well as at the end faces with an elastic material.

The electrodes 11 are comprised of a material having a low modulus of elasticity E which may, for example, be approximately $2\times10^5$ kp/cm$^2$ and having a high ductility corresponding to a hardness of grade 1.2 after the scale of MOS or 3 kp/mm$^2$ after Vickers and high electrical conductivity in the range of $5\times10^6$ mhos/m. A material exhibiting these properties which may, for example, be utilized to comprise the electrodes is lead or indium. In a writing jet constructed as described above with a writing fluid channel having a diameter of approximately 0.8 mm which is surrounded by a winding extending over approximately 10 mm of the channel length, ejection of writing fluid droplets from a discharge aperture having a diameter of approximately 40 microns at a velocity of 4 m/sec. can be achieved with an impulse voltage of only 35 volts.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a fluid ejecting writing jet having a cylindrical channel containing said fluid which terminates in a discharge aperture, a drive element for separately forcing droplets of said fluid out of said channel comprising a power consuming winding having a plurality of adjacent plies of a first foil comprised of piezoelectric material and a second foil comprised of insulating material which cylindrically surround a portion of said channel, said foils being coiled together such that said plies are in contact with adjacent plies over a substantial portion of their respective surfaces, and a means for connecting said winding to a pulsed voltage source for expanding and contracting the interior diameter of said winding and generating pressure for expelling said droplets of fluid from said channel.

2. The drive element of claim 1 wherein said foil comprised of piezoelectric material is comprised of polyvinylidene difluoride.

3. The drive element of claim 1 wherein the foils comprising the winding are coated with a viscous adhesive.

4. The drive element of claim 1 wherein the winding is directly cast into a housing surrounding a portion of the channel.

5. The drive element of claim 1 wherein said winding is encapsulated over its outer surface and end faces with an elastic material.

6. The drive element of claim 1 wherein said means for connecting said winding to a pulsed voltage source are electrodes attached to said winding, said electrodes comprised of a material having a low modulus of elasticity, a high ductility and a high electrical conductivity.

* * * * *